(12) United States Patent
Liao

(10) Patent No.: US 6,350,682 B1
(45) Date of Patent: Feb. 26, 2002

(54) METHOD OF FABRICATING DUAL DAMASCENE STRUCTURE USING A HARD MASK

(75) Inventor: Kuan-Yang Liao, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/073,920

(22) Filed: May 6, 1998

(30) Foreign Application Priority Data

Jan. 23, 1998 (TW) ........................................ 87100935 A

(51) Int. Cl.$^7$ ..................... H01L 21/4763; H01L 21/44; H01L 21/461
(52) U.S. Cl. ..................... 438/638; 438/633; 438/648; 438/671; 438/672; 438/685; 438/692; 438/734; 438/740
(58) Field of Search ..................... 438/638, 637, 438/640, 639, 633, 629, 672, 631, 648, 634, 685, 671, 692, 684, 740, 734

(56) References Cited

U.S. PATENT DOCUMENTS

| | | | | |
|---|---|---|---|---|
| 5,635,423 A | * | 6/1997 | Huang et al. | 437/195 |
| 5,663,101 A | * | 9/1997 | Cronin | 438/637 |
| 5,736,457 A | * | 4/1998 | Zhao | 438/637 |
| 5,801,094 A | * | 9/1998 | Yew et al. | 438/624 |
| 5,821,169 A | * | 10/1998 | Nguyen et al. | 438/736 |
| 6,077,769 A | * | 6/2000 | Huang et al. | 438/622 |

\* cited by examiner

*Primary Examiner*—Ha Tran Nguyen
(74) *Attorney, Agent, or Firm*—Thomas, Kayden, Horstemeyer & Risley

(57) ABSTRACT

A method of fabricating dual damascene structure. A substrate having devices and a defined conductive layer is provided. A dielectric layer and a hard mask material layer are formed respectively over the substrate. An opening is defined within the hard mask material layer. Because of the different selectivity of the hard mask material layer and the dielectric layer, a trench is formed within the dielectric layer by defining the hard material mask layer and a portion of dielectric layer until the conductive layer is exposed. The cross shape of the trench has a wider opening and a narrower bottom. A metal layer is then formed and the trench is filled up with the metal layer. The process of dual damascene structure is accomplished..

20 Claims, 4 Drawing Sheets

METHOD OF FABRICATING DUAL DAMASCENE STRUCTURE USING A HARD MASK

CROSS-REFERENCE TO RELATED APPLICATION

This application claims priority benefit of Taiwan application Serial no. 87100935, filed Jan. 23, 1998, the full disclosure of which is incorporated herein by reference.

BACKGROUND OF THE INVENTION

1. Field of the Invention

The invention relates to a method of fabricating dual damascene structure, and more particularly to a method of fabricating dual damascene structure which can improve the reliability of devices.

2. Description of the Related Art

FIGS. 1A–1D is a cross sectional view of the conventional method of fabricating dual damascene structure. Referring to FIG. 1A, a substrate 100 having devices (not shown) is provided, and a defined conductive layer 102, is formed on the substrate 100. An oxide layer 104 and a silicon nitride layer 106 are deposited respectively on the substrate 100. Referring to FIG. 1B, the silicon nitride layer 106 is patterned by photolithography and an opening is then formed. An insulating layer 108 is formed on the substrate 100. The pattern of photoresist 110 anisotropically is used to define the insulating layer 108 by dry etching. When the insulating layer 108 is etched, using the silicon nitride layer 106a as a masking layer, and the oxide layer 104 which isn't covered by the silicon nitride layer 106a is etched until the conductive layer 102 is exposed. A trench 112, as shown in FIG. 1C, is then formed within the insulating layer 108a and the oxide layer 104a. A metal layer 114 is formed on the insulating layer 108a and the trench 112 is filled with the metal layer 114. The metal layer 114 is then planarized by chemical mechanical polishing (CMP) so a structure of the trench 114 filled up with metal layer 114 as shown in FIG. 1D is formed.

In the prior art as described above, the silicon nitride layer 106 is used to form on the oxide layer 104. The silicon nitride layer 106 is used as not only a barrier layer but also a masking layer for etching. Because the material characteristics of the silicon nitride layer 106, electrons can be easily trapped at the interface of the silicon nitride layer 106 and the oxide layer 104, and a semi-conduction layer is formed at the interface. When voltage is applied on the wiring lines, the semi-conduction layer induces crosstalk or short circuit and the reliability of devices decreases.

SUMMARY OF THE INVENTION

It is therefore an object of the invention to provide a method of fabricating dual damascene structure without the formation of the silicon nitride layer. The occurrence of leakage current, crosstalk or short circuit between metal layers can be prevented. The device reliability can be improved and the process can be simplified.

To achieve these objects and advantages, and in accordance with the purpose of the invention, as embodied and broadly described herein, the invention is directed towards a method of fabricating dual damascene structure. A substrate having devices and a defined conductive layer is provided. A dielectric layer and a hard mask material layer are formed respectively over the substrate. An opening is defined within the hard mask material layer. Because the different selectivity of the hard mask material layer and the dielectric layer, a trench is formed within the dielectric layer by defining the hard material mask layer and a portion of dielectric layer until the conductive layer is exposed. The cross shape of the trench has a wider opening and a narrower bottom. A metal layer is then formed and the trench is filled up with the metal layer. The process of dual damascene structure is accomplished.

It is to be understood that both the foregoing general description and the following detailed description are exemplary and explanatory only and are not restrictive of the invention, as claimed.

DESCRIPTION OF THE PREFERRED EMBODIMENTS

FIGS. 2A–2D schematically illustrate processing steps in the formation of dual damascene structure in accordance with preferred embodiments of the present invention.

Figure 1A:
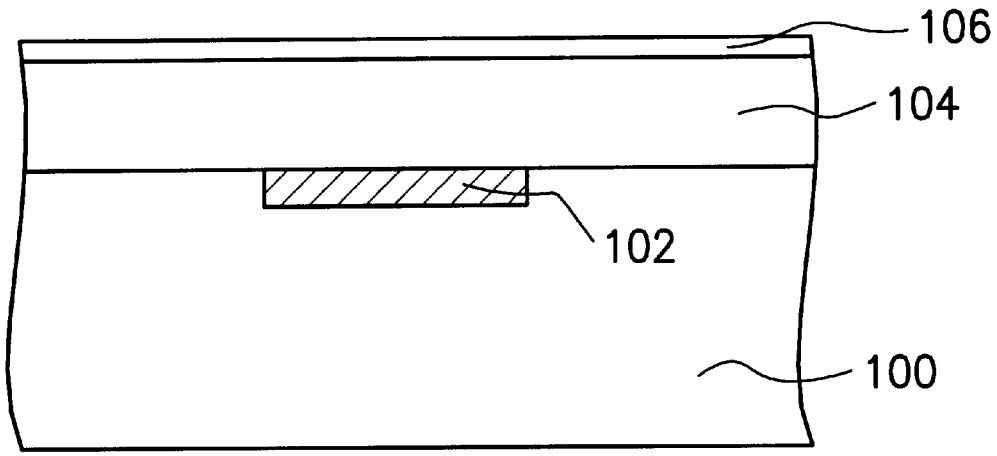
FIGS. 1A–1D is a cross sectional view of the conventional method of fabricating dual damascene structure.
Figure 1B:
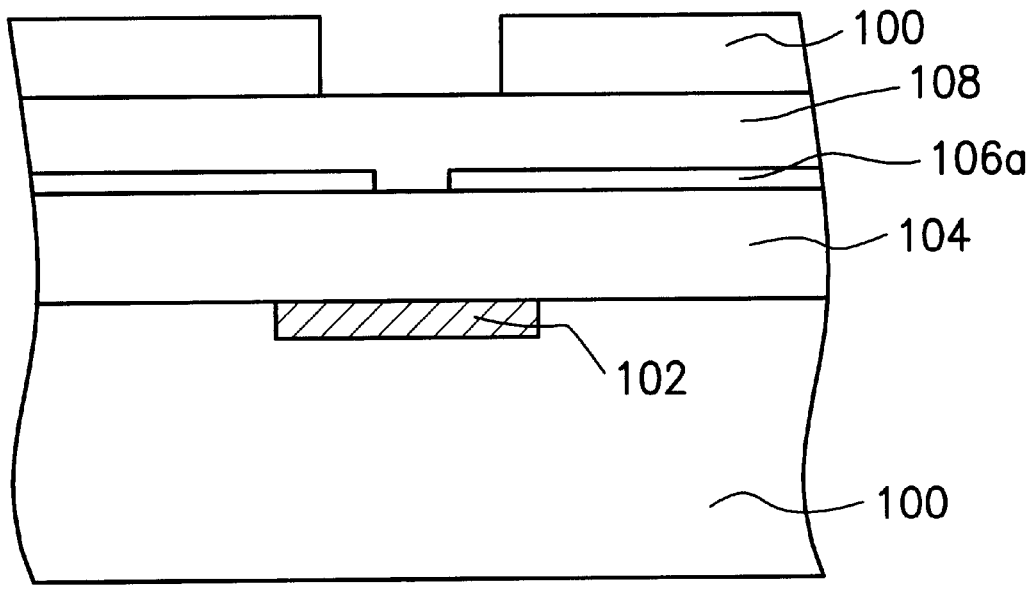
Figure 1C:
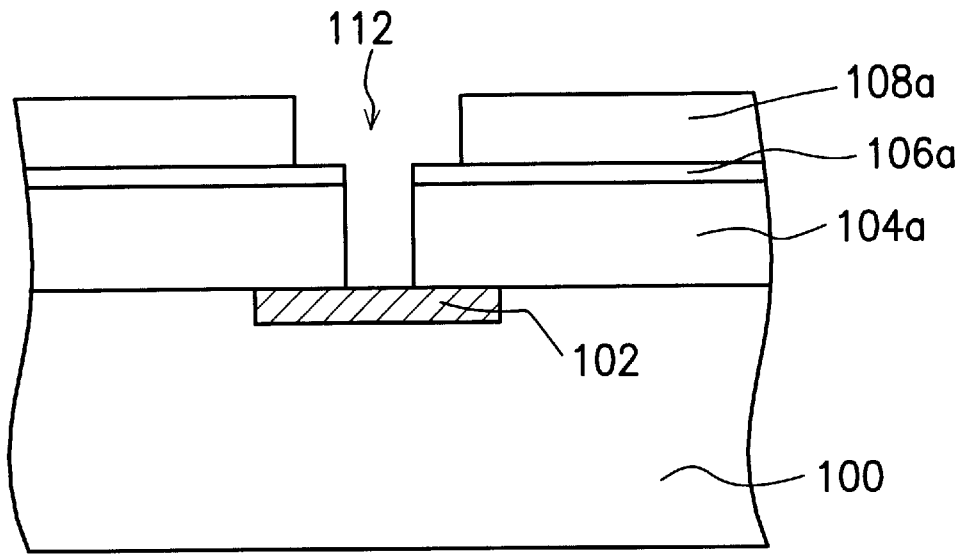
Figure 1D:
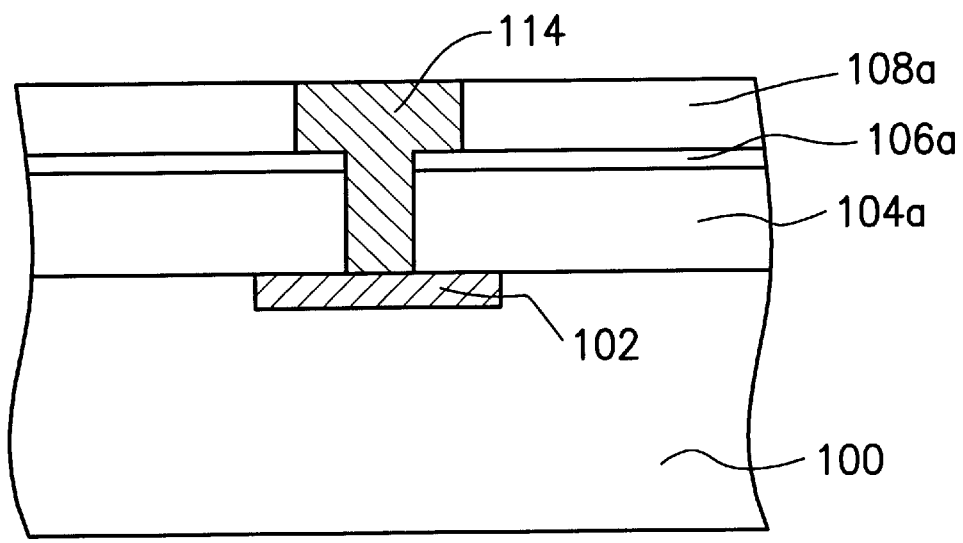
Figure 2A:
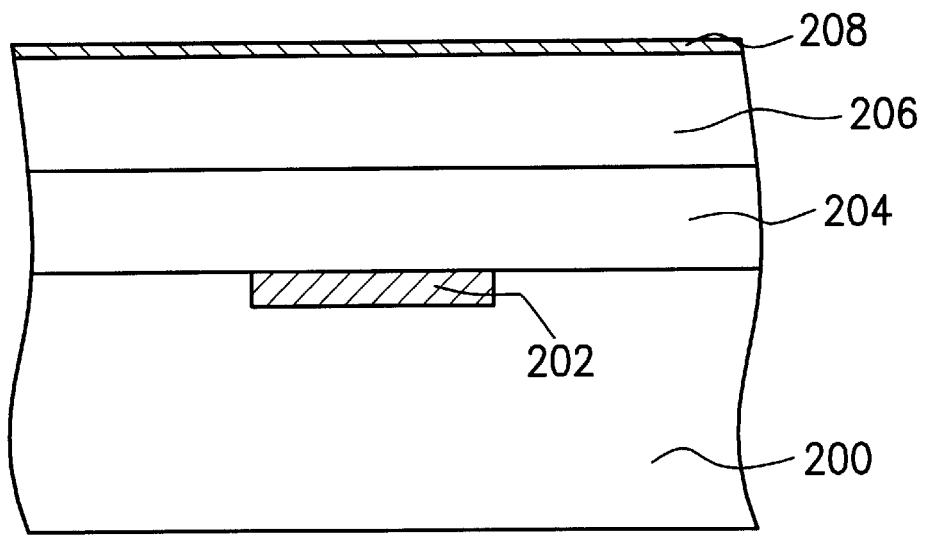
FIGS. 2A–2D schematically illustrate processing steps in the formation of dual damascene structure in accordance with preferred embodiments of the present invention.

Referring to FIG. 2A, a substrate 200 is provided and devices (not shown) such as a MOS transistor are formed thereon. A defined conductive layer 202 such as a metal layer or a polysilicon layer is formed on the substrate 200. A first dielectric layer 204, a second dielectric layer 206 and a hard mask material layer 208 are formed successively on the substrate 200 by chemical vapor deposition (CVD) or sputtering. The first dielectric layer 204 and the second dielectric layer 206 include oxide or other low k dielectric material. The material characteristic of hard mask material layer 208 is different from that of the oxide as used in the dielectric layers 204, 206. The hard mask material 208 includes titanium, titanium nitride, polysilicon or other metals and to a thickness in a range about 100 to 2000 Å. In addition, the first dielectric layer 204 and the second dielectric layer 206 can be used instead of a thicker dielectric layer and the thickness of the thicker dielectric layer corresponds to the first dielectric layer and the second dielectric layer.

Figure 2B:
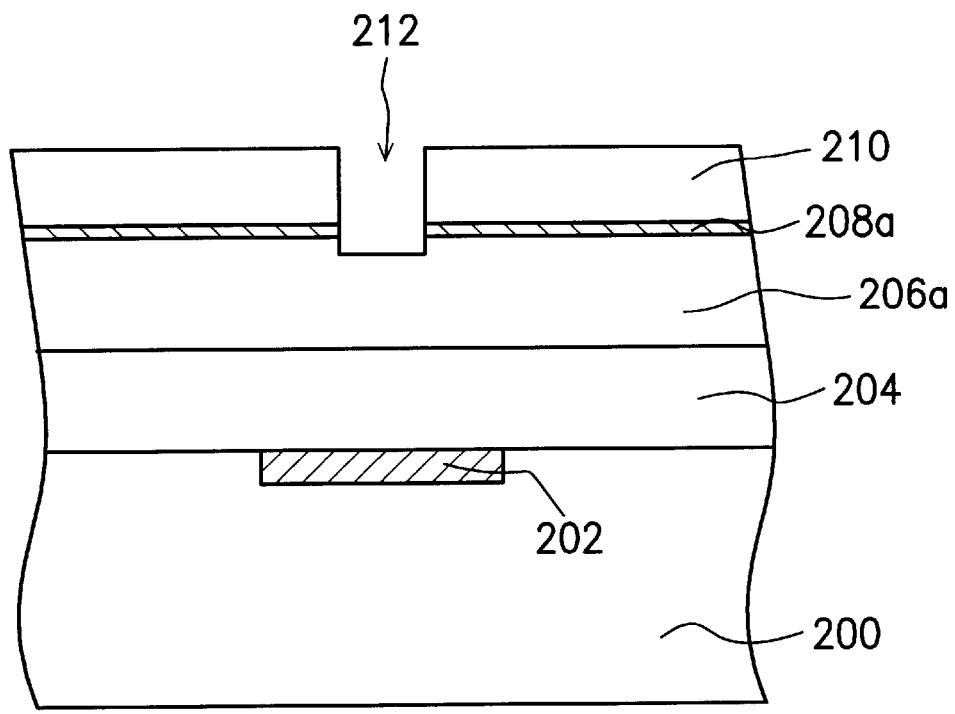

Referring to FIG. 2B, the contact or via pattern is defined by photoresist 210 on the hard mask material layer 208a. By using anisotropic dry etching, a portion of hard mask material layer 208a is removed and a contact or via opening 212 is formed within the hard mask material layer 208a. The opening 212 is over the conductive layer 202 and the second dielectric layer 206a is exposed when the opening 212 is formed. A portion of the second dielectric layer 206a is usually etched to make sure the hard mask material layer 208a is removed completely.

If a thicker dielectric layer is used instead of the first dielectric layer 204 and the second dielectric layer 206, it is still necessary to etch a portion of the thicker dielectric layer as the opening is formed.

Figure 2C:
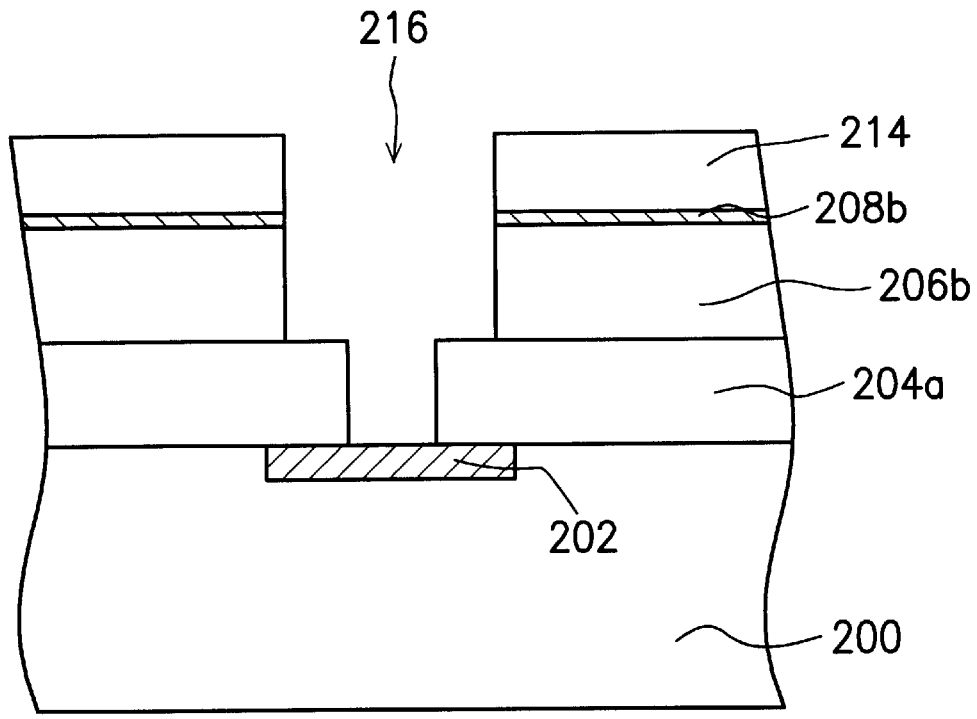
Figure 2D:
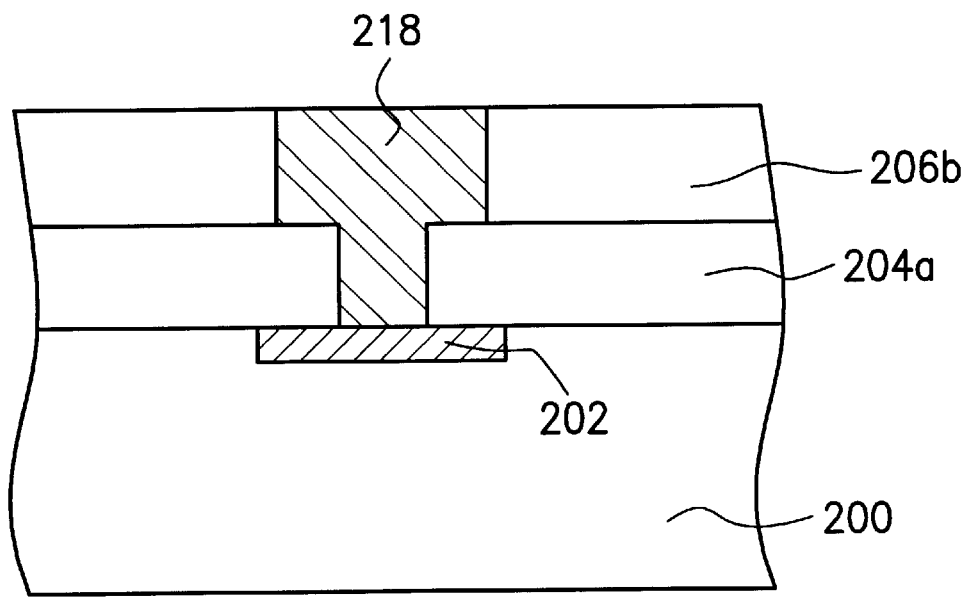

The metal pattern is then defined by photolithography with photoresist 214 on the hard mask material layer 208b. A high selectivity and anisotropic dielectric etch is performed to etch the second dielectric layer 206b and partial first dielectric layer 204a with hard mask material 208b as the mask. A low selectivity (to hard mask material) and anisotropic dielectric etch is then followed to clear hard mask material 208b and the second dielectric layer 206b with photoresist 214 as the mask, as shown in FIG. 2C. Along the opening 216, a trench 216 is formed within the second dielectric layer 206b and the first dielectric layer 204a and the conductive layer 202 is exposed while defining the hard mask material layer 208b and the second dielectric layer 206b. Because of the different selectivity of hard mask material layer 208b and the second dielectric layer 206b, the first dielectric layer 204a is not overetched when the second dielectric layer 206b is etched by anisotropic etching process. Therefore, the cross shape of the trench has a wider opening and a narrower bottom. The photoresist 214 is then removed.

A thicker dielectric layer can be used instead of the first dielectric layer 204 and the second dielectric layer 206. Because of the selectivity of the hard mask material layer 208b and the thicker dielectric layer, the thicker dielectric layer is not etched through thoroughly as the thicker dielectric layer is defined. A trench is formed with the dielectric layer and the conductive layer 202 is exposed. The cross shape of the trench has a wider opening and a narrower bottom.

Referring to FIG. to 2D, the trench is filled up with a metal layer 218, which is formed on the hard mask material layer 208a by sputtering. The excess metal layer 218 and the hard mask material layer 208b are removed from the surface of the second dielectric layer 206b by chemical mechanical polishing and the second dielectric layer 206b is exposed. The metal layer 218 is therefore planarized.

This invention is directed towards provision of a hard mask material on the dielectric layer. Because of the different selectivity of the hard mask material layer and the dielectric layer, the dual damascene structure can be accomplished without a silicon nitride layer. Therefore, short circuit in the conductive layer can be prevented and the device reliability can be enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating dual damascene structure, wherein a substrate having devices and a defined conductive layer are provided, comprising:
    forming a dielectric layer and a hard mask material layer on the substrate;
    forming an opening within the hard mask material layer to expose the dielectric layer, wherein the opening is directly over the conductive layer;
    after forming the opening, defining the hard mask material layer and the dielectric layer, to form a trench with a wider upper portion and a narrower bottom portion under the hard mask material layer with the opening, and the bottom portion of the trench exposing the defined conductive layer, wherein a selective etching ratio is used to etch the dielectric layer faster than the hard mask material layer, and a portion of the hard mask material layer with respect to the trench is removed; and
    forming a metal layer to fill the trench.

2. The method according to claim 1, wherein the thickness of the hard mask material layer is in a range of about 100 to 2000 Å.

3. The method according to claim 1, wherein the hard mask material layer includes titanium.

4. The method according to claim 1, wherein the hard mask layer includes polysilicon.

5. The method according to claim 1, wherein the hard mask layer includes metal film.

6. The method according to claim 1, wherein hard mask material layer includes a metal nitride layer.

7. The method according to claim 6, wherein the metal nitride layer includes titanium nitride.

8. The method according to claim 1, wherein the material characteristic of the hard mask material layer is different from the dielectric layer.

9. The method according to claim 1, wherein forming a metal layer to fill up the trench further comprises
    forming a metal layer on the hard mask material layer, the metal layer filling the opening; and
    removing the metal layer and the hard mask material layer from the surface of the dielectric layer by chemical mechanical polishing.

10. A method of fabricating dual damascene structure, wherein a substrate having devices and a defined conductive layer are provided, comprising:
    forming a first dielectric layer on the substrate;
    forming a second dielectric layer on the first dielectric layer;
    forming a hard mask material layer on the second dielectric layer;
    forming an opening within the hard mask material layer to expose the second dielectric layer, the opening being directly over the defined conductive layer;
    defining the hard mask material layer, the second dielectric layer, and the first dielectric layer using a photoresist layer as a mask to form a trench with a wider upper portion and a narrower bottom portion under the hard mask material layer with the opening, wherein the bottom portion of the trench in the second dielectric layer and the first dielectric layer exposes the defined conductive layer, wherein a selective etching ratio is used to etch the first and the second dielectric layers faster than the hard mask material layer, and a portion of the hard mask material layer with respect to the trench is removed;
    removing the photoresist layer; and
    forming a metal layer to fill up the trench.

11. The method according to claim 10, wherein the first dielectric layer includes oxide.

12. The method according to claim 10, wherein the second dielectric layer includes low k dielectric material.

13. The method according to claim 10, wherein the thickness of the hard mask material layer is in a range of about 100 to 2000 Å.

14. The method according to claim 10, wherein the hard mask material layer includes titanium.

15. The method according to claim 12, wherein the hard mask layer includes polysilicon.

16. The method according to claim 12, wherein the hard mask layer includes metal film.

17. The method according to claim 12, wherein the hard mask material layer includes a metal nitride layer.

18. The method according to claim 17, wherein the metal nitride layer includes titanium nitride.

19. The method according to claim 12, wherein the material characteristic of the hard mask material layer is different from the dielectric layers.

20. The method according to claim 10, wherein forming a metal layer to fill up the trench further comprises:
    forming a metal layer on the hard mask material layer, the metal layer filling up the opening; and
    removing the metal layer and the hard mask material layer from the surface of the second dielectric layer by chemical mechanical polishing.

* * * * *